United States Patent [19]

McGann

[11] Patent Number: 4,604,589
[45] Date of Patent: Aug. 5, 1986

[54] HIGH FREQUENCY CIRCUIT

[75] Inventor: Melvyn McGann, Chelmsford, United Kingdom

[73] Assignee: The Marconi Company Limited, Stanmore, Middlesex, England

[21] Appl. No.: 680,293

[22] Filed: Dec. 10, 1984

[30] Foreign Application Priority Data

Jan. 19, 1984 [GB] United Kingdom ............... 8401384

[51] Int. Cl.$^4$ ........................... H03C 1/06; H03F 3/68
[52] U.S. Cl. ................................... 332/37 R; 330/295
[58] Field of Search ............ 330/10, 295, 126, 124 R, 330/149, 151; 332/37 R

[56] References Cited

U.S. PATENT DOCUMENTS 4,329,655 5/1982 Nojima et al. ...................... 330/149

FOREIGN PATENT DOCUMENTS 1369603 of 1974 United Kingdom .

Primary Examiner—Eugene LaRoche
Assistant Examiner—G. Wan
Attorney, Agent, or Firm—Spencer & Frank

[57] ABSTRACT

A high frequency circuit is arranged to modify a signal, such as a television broadcast signal, prior to high power amplification so as to compensate for distortions introduced by the amplifier. Separate signal paths give independent adjustment of the differential gain, differential phase and linearity of the signal by altering the characteristics of level dependent detectors.

15 Claims, 1 Drawing Figure

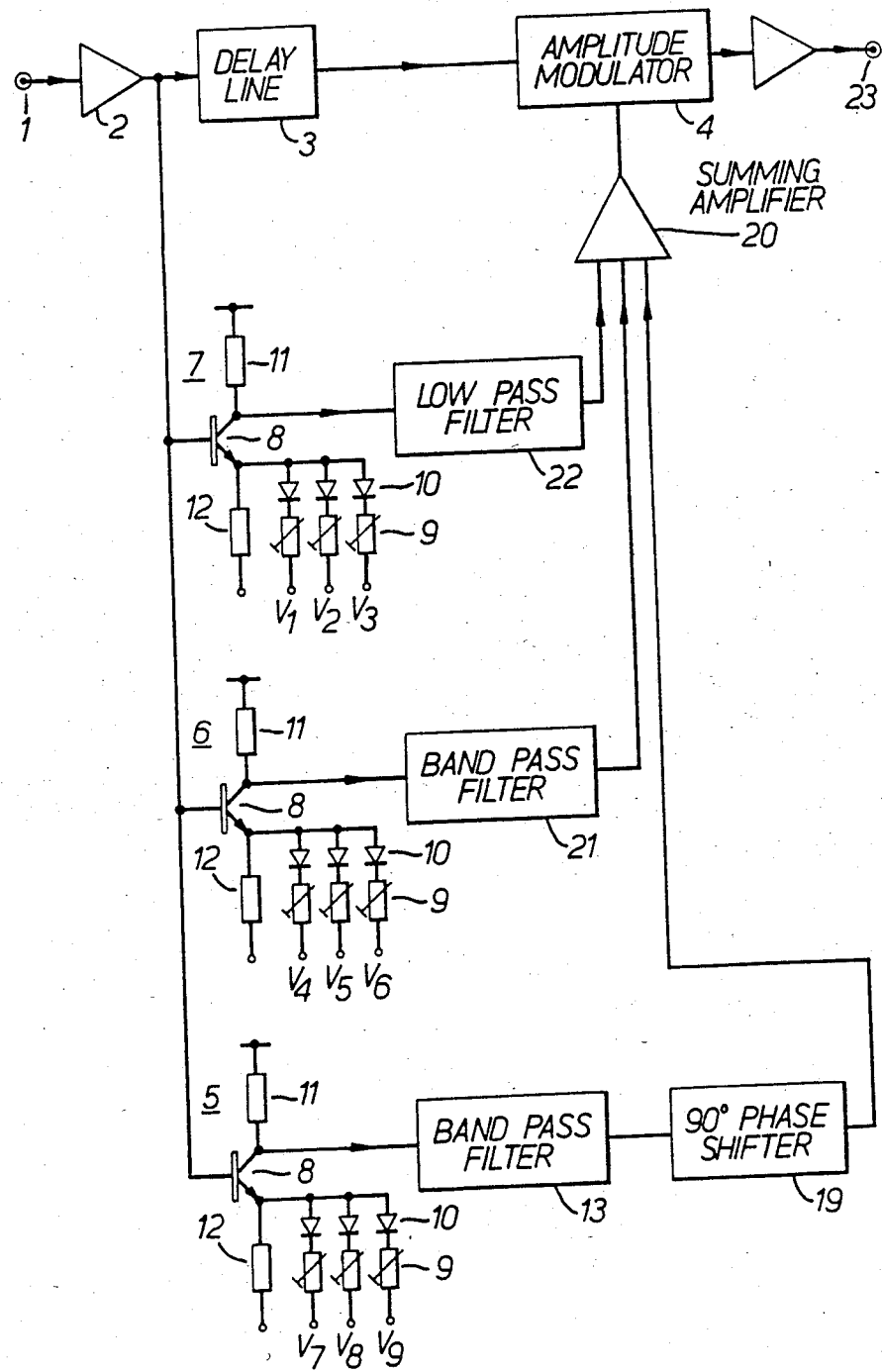

HIGH FREQUENCY CIRCUIT

1. Background of the Invention

This invention relates to high frequency circuits, and is particularly suitable for inclusion in a high power radio transmitter or the like which introduces undesirable signal distortions. High power amplifier devices, such as klystrons and tetrode vacuum tubes inevitably distort the signals which they amplify, and for certain applications it is very important to keep distortions in a transmitted signal to a minimum. For example, the characteristics of a broadcast color television signal must be kept within clearly defined limits. It has been proposed to introduce pre-distortion into a signal in such a sense as to compensate for the distortion which is subsequently caused during a high power amplification stage. The present invention seeks to provide an improved circuit which is simple and relatively easy to set up so as to exhibit specified characteristics.

2. Summary of the Invention

According to this invention a high frequency correction circuit includes means for receiving a wideband high frequency signal, and for routing it via a delay device to an amplitude modulator; a level dependent detector to which the received signal is applied, and which modifies the amplitude of the signal in a manner which is itself dependent upon the amplitude; a broadband 90° phase shifter arranged to receive the amplitude modified signal and the output of which is fed to the amplitude modulator so as to adjust the phase of said received signal which is routed to it via the delay device.

The effect of using the phase shifted signal as the modulation signal of the amplitude modulator is to shift the relative phases of the various frequency components of the received signal; that is to say, the differential phase characteristic of the received signal is modified. If the received signal represents the i.f. stage of a color television signal, the action of the circuit as defined above is to shift the phase of the color sub-carrier relative to that of the main vision carrier.

Preferably, a further level dependent detector is provided in parallel with the first mentioned level dependent detector, with the output of a further detector being fed into the modulation input port of the amplitude modulator, either directly or after combination with the output signal of said 90° phase shifter. Thus no phase shifter is associated with the further level dependent detector. By adjustment of the characteristics of the further level dependent detector, the differential gain characteristic of the received signal is modified.

Preferably, the bandpass filter is provided in the output path of each level dependent detector. The bandwidth of the filter corresponds to that of the vision signal, i.e. about 5½ MHz, in the case of a color television signal.

If it is desired to incorporate a linearity adjustment feature in the circuit, then an additional level dependent detector can be provided which is smaller to one of the aforementioned detectors, but with its output being fed via a low pass filter to the amplitude modulator, rather than via the bandpass filter.

BRIEF DESCRIPTION OF THE DRAWING

The invention is further described by way of example with reference to the accompanying drawing which shows a high frequency circuit having facility for adjusting the differential phase, differential gain and linearity of a color television signal.

DESCRIPTION OF THE PREFERRED EMBODIMENT

Referring to the drawing, there is shown therein a circuit which can be used to correct various error characteristics introduced into a television signal which is amplified using a klystron amplifier prior to transmission at a radiating antenna. As is well known, klystron amplifiers or the like introduce significant frequency and amplitude dependent distortions into the signal which they amplify, and it has been proposed to compensate for these distortions by introducing a predistortion in a complementary sense, and to subsequently apply the compensated signal to the klystron amplifier. There are three main ways in which the characteristics of the signal can be degraded. The first is differential phase and relates to the variation of the phase of a sideband in a modulated wave as the amplitude of the carrier varies. The second characteristic is termed differential gain, which represents the variation of the amplitude of the sideband in a modulated wave as the amplitude of the carrier varies. The third characteristic is related to undesirable variations in amplitude linearity.

Part of a color television transmitter chain is illustrated in the drawing. The vision intermediate frequency signal is applied to terminal 1. Typically, this signal consists of a television video signal which is modulated on to a carrier frequency, which is normally in the 35 MHz to 47 MHz region. This signal is applied via an amplifier 2 and a delay line 3 to an amplitude modulator 4. The output of the amplifier 2 is also fed to three correction circuits indicated generally at 5, 6 and 7. Circuit 5 is operative to provide compensation for differential phase distortion, circuit 6 provides differential gain compensation and circuit 7 provides amplitude linearity compensation.

Each of the three circuits contains a level dependent detector, which comprises a respective transistor 8 in conjunction with an array of adjustable impedances 9, each being in series with an associated diode 10. Each of the impedances 9 is connected to a variable potential source V1 to V9 as indicated. A suitable d.c. bias is applied to each transistor via the current path represented by the two impedances 11 and 12 associated with each transistor. Each diode conducts at points on the amplitude of the input envelope of the received signal when the instantaneous voltage at the emitter of a respective transistor is greater than the corresponding bias voltage V1 to V9 (allowing of course, for the forward voltage dropped across a diode 10). In this way, appropriately tailored pre-distortion can be applied to the received envelope. Circuits 5 and 6 both contain a bandpass filter which is operative to select only those frequencies where circuit action is required. In the present example, the suitable range of frequencies is centered on that of the color sub-carrier of about 4.43 MHz, and the filters have a bandpass extending from about 3½ MHz to 5½ MHz, but the bandwidth value will be altered if a different subcarrier frequency is used. The filters are arranged to exhibit constant delay which is frequency independent so that the different frequencies which are passed by the filters are not time staggered, but remain in synchronism.

Circuit 5 achieves differential phase compensation by passing the output of the bandpass filter 13 through a wideband 90° phase shifter 19. The output of the phase shifter 19 is applied to one input of a summing amplifier 20, which in turn is used to introduce amplitude modulation into the original wideband video signal. By adjusting the bias levels $V_7$, $V_8$, $V_9$, the variation of differential phase with amplitude can be controlled. Clearly, additional resistors 9 and bias levels can be provided to give a finer degree of control.

The circuit 6 operates in a very similar manner, but its bandpass filter 21 is not followed by a phase shifter, as instead the filtered signal is fed directly into the summing amplifier 20. The frequency response of the filter 21 is very similar to that of filter 13, but the bias levels $V_4$, $V_5$, $V_6$ are individually adjusted so as to control the amplitude of the signal applied by the filter 21 to the amplifier 20. In this way, a signal representative of a required degree of differential gain is generated, and the corresponding modulation is applied by the amplitude modulator 4.

Typically, in the case of a color television signal, the bandwidth of the filters 13 and 21 is about $5\frac{1}{2}$ MHz, as previously mentioned, which corresponds to the video frequency components.

The linearity control circuit 7 is very similar to that of circuit 6, except that a low pass filter 22 is used instead of a bandpass filter, the frequency response extending from a value of about 0.8 MHz to 1.2 MHz down to a very low frequency value which approaches zero Hertz. The characteristics of the linearity circuit are adjusted using the bias voltages $V_1$, $V_2$, $V_3$, although more bias sources can be added as necessary.

The three correction circuits 5, 6, 7 together give a very comprehensive degree of control over the frequency dependent characteristics of the signal made available at output terminal 23. These characteristics can represent a pre-distortion in a sense which is complementary to an unavoidable distortion which is introduced in a following high power amplification stage.

I claim:

1. A high frequency correction circuit including means for receiving a wideband high frequency signal, and for routing it via a delay device to an amplitude modulator; a level dependent detector to which the received signal is applied, and which modifies the amplitude of the signal in a manner which is itself dependent upon the amplitude; a broadband 90° phase shifter arranged to receive the amplitude modified signal and the output of which is fed to the amplitude modulator so as to adjust the phase of said received signal which is routed to it via the delay device.

2. A circuit as claimed in claim 1 and wherein a further level dependent detector is provided in parallel with the first mentioned level dependent detector, with the output of the further detector being fed into the modulation input port of the amplitude modulator.

3. A circuit as claimed in claim 2 and wherein a bandpass filter is provided in the output path of at least one of the level dependent detectors.

4. A circuit as claimed in claim 2 and wherein an additional level dependent detector is provided in parallel with the first and second mentioned level dependent detectors, with the output of the additional detector being fed via a low pass filter to the amplitude modulator.

5. A circuit as claimed in claim 2 wherein the output of said further level dependent detector is fed directly into the modulation input port of the amplitude modulator.

6. A circuit as claimed in claim 2 wherein the output of said further level dependent detector is fed into the modulation input port of the amplitude modulator after being combined with the output signal of said phase shifter.

7. A circuit as claimed in claim 4 wherein each of said level detectors comprises a plurality of diodes having one end coupled to said means for receiving said wideband high frequency signal, and means for coupling the other end of each of said diodes to a corresponding voltage source, each of said diodes being biased into conduction in accordance with the magnitudes of said wideband high frequency signal and its corresponding voltage source.

8. A circuit as claimed in claim 7 wherein said one ends of said plurality of diodes are coupled to said means for receiving said wideband high frequency signal by a transistor, the current through said transistor being dependent on the number of diodes that have been biased into conduction.

9. A correction circuit for compensating for distortion in a succeeding amplifier stage comprising
an input terminal for receiving a wideband high frequency signal;
an amplitude modulator having first and second inputs and an output;
a delay device for coupling said input terminal to the first input of said amplitude modulator;
a first level-dependent detector having an input coupled to said input terminal, said first level-dependent detector modifying the amplitude of said wideband high frequency signal in accordance with the amplitude thereof;
a broadband phase shifter for producing a fixed phase shift of 90° coupled to the output of said first level-dependent detector, said phase shifter adjusting the phase of the amplitude modified signal at the output of said first level-dependent detector; and
summing means for coupling the output of said phase shifter to the second input of said amplitude modulator, whereby the differential phase characteristics of said wideband high frequency signal are varied to compensate for distortion in said succeeding amplifier stage.

10. A circuit as claimed in claim 9 which further comprises a second level-dependent detector having an input coupled to said input terminal and an output coupled to said summing means, whereby the differential gain characteristics of said wideband high frequency signal are varied to compensate for distortion in said succeeding amplifier stage.

11. A circuit as claimed in claim 10 wherein a bandpass filter is interposed between said second level-dependent detector and said summing means.

12. A circuit as claimed in claim 9 which further comprises a third level-dependent detector having an input coupled to said input terminal and an output coupled to said summing means, whereby the linearity of said wideband high frequency signal is varied to compensate for distortion in said succeeding amplifier stage.

13. A circuit as claimed in claim 10 which further comprises a third level-dependent detector having an input coupled to said input terminal and an output coupled to said summing means, whereby the linearity of said wideband high frequency signal is varied to compensate for distortion in said succeeding amplifier stage.

14. A circuit as claimed in claim 12 wherein a low pass filter is interposed between said third level-dependent detector and said summing means.

15. A circuit as claimed in claim 13 wherein a low pass filter is interposed between said third level-dependent detector and said summing means.

* * * * *